(12) United States Patent
Kartal et al.

(10) Patent No.: US 6,914,296 B2
(45) Date of Patent: Jul. 5, 2005

(54) CONTROLLABLE SEMICONDUCTOR COMPONENT WITH MULTI-SECTION CONTROL ELECTRODE

(75) Inventors: Veli Kartal, München (DE); Hans-Joachim Schulze, Ottobrunn (DE)

(73) Assignee: Eupec Europäische Gesellschaft für Leistungshalbleiter GmbH & Co. KG, Warstein-Belecke (DE)

( * ) Notice: Subject to any disclaimer, the term of this patent is extended or adjusted under 35 U.S.C. 154(b) by 0 days.

(21) Appl. No.: 10/393,165

(22) Filed: Mar. 20, 2003

(65) Prior Publication Data

US 2003/0155581 A1 Aug. 21, 2003

Related U.S. Application Data

(63) Continuation of application No. PCT/EP01/10752, filed on Sep. 17, 2001.

(30) Foreign Application Priority Data

Sep. 22, 2000 (DE) .......................... 100 47 168

(51) Int. Cl.$^7$ .................. H01L 29/76; H01L 29/94; H01L 29/74
(52) U.S. Cl. .................. 257/341; 257/139; 257/342
(58) Field of Search .................. 257/350, 341, 257/342, 139, 365, 366, 315, 316, 317, 319, 320, 336, 339

(56) References Cited

U.S. PATENT DOCUMENTS 4,716,446 A * 12/1987 Esser et al. .................. 257/336

| | | | |
|---|---|---|---|
| 5,414,467 A | 5/1995 | Komatsu | 348/322 |
| 5,852,559 A | 12/1998 | Li | 363/163 |
| 6,005,267 A | 12/1999 | Griffin et al. | 257/280 |
| 6,069,372 A | * 5/2000 | Uenishi | 257/139 |

FOREIGN PATENT DOCUMENTS

| | | | | |
|---|---|---|---|---|
| DE | 28 55 844 A1 | 6/1980 | .......... | H01L/29/78 |
| EP | 0 020 164 A1 | 5/1980 | .......... | H01L/29/60 |
| EP | 0 212 120 A1 | 6/1986 | .......... | H01L/31/10 |
| EP | 0 329 047 A2 | 2/1989 | .......... | H01L/29/60 |
| EP | 0 330 142 A2 | 2/1989 | .......... | H01L/29/60 |

OTHER PUBLICATIONS

International Search Report, PCT/EP01/10752, Nov. 2, 2002.

* cited by examiner

*Primary Examiner*—Steven Loke
(74) *Attorney, Agent, or Firm*—Baker Botts L.L.P.

(57) ABSTRACT

The controllable semiconductor component (1) has a body (10) consisting of doped silicon. Two separate electrodes (3, 4) are connected to the silicon, between which an electric operating voltage (U) of the component (1) is applied. A control electrode (2), to which an electric control voltage (Us) for controlling the component (1) is applied, is insulated from the silicon of the body (10) by electric insulation material (100). According to the invention, the control electrode (2) has two control electrode sections (21, 22), separated from one another by a gap (23). Said semiconductor component can be used for IGBTs and MOS transistors.

15 Claims, 4 Drawing Sheets

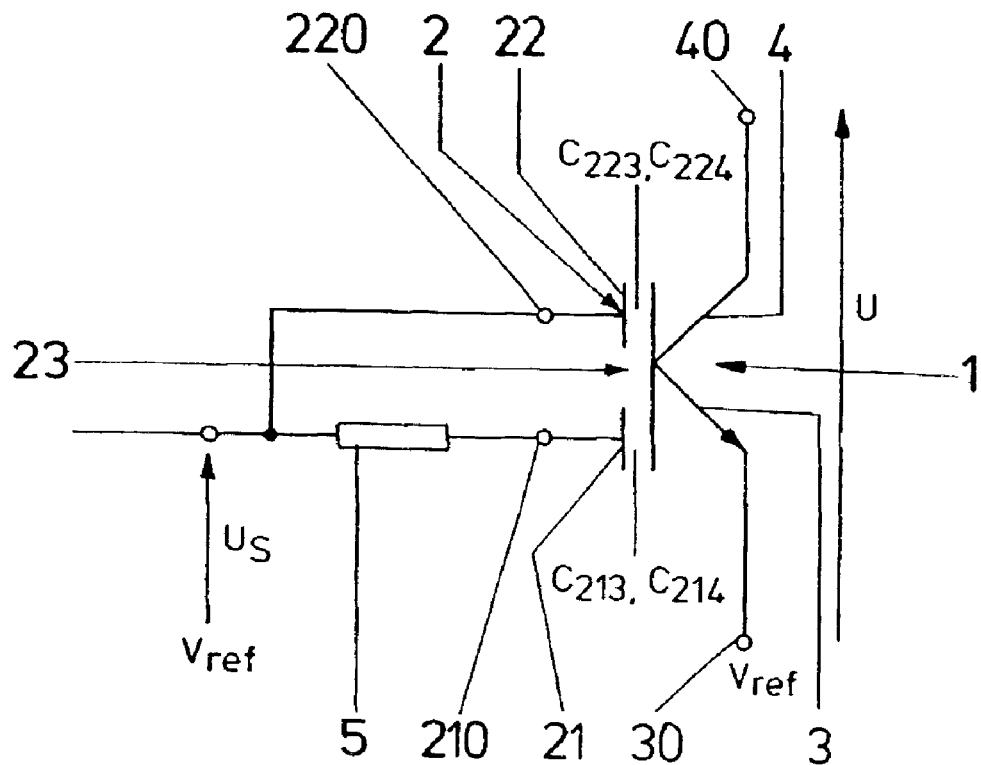
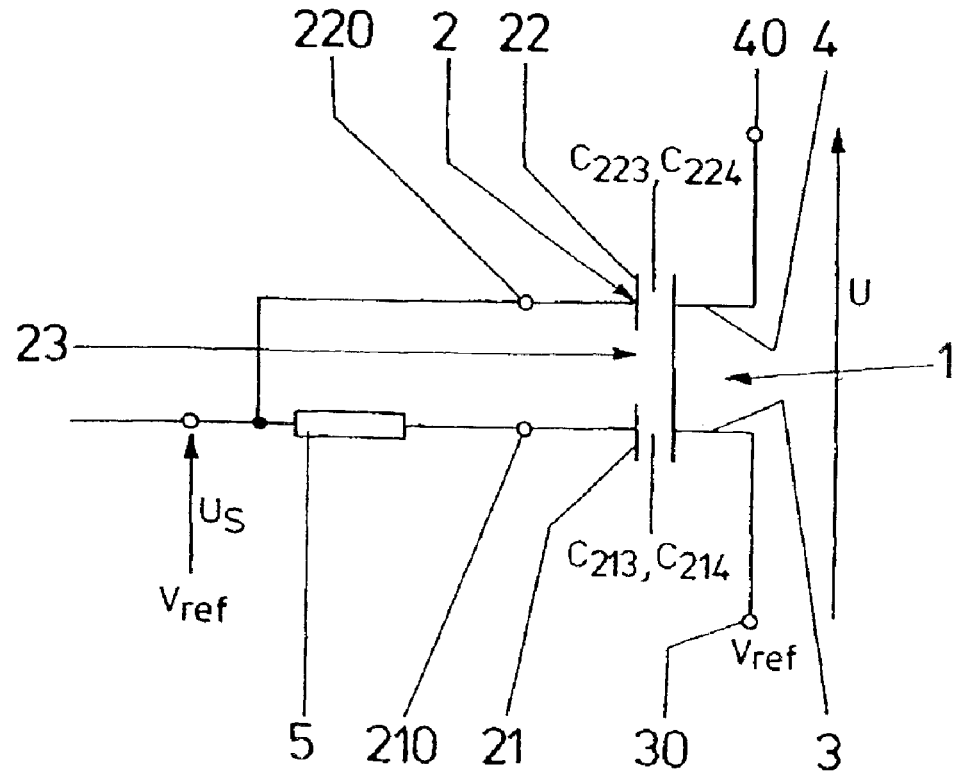

CONTROLLABLE SEMICONDUCTOR COMPONENT WITH MULTI-SECTION CONTROL ELECTRODE

CROSS REFERENCE TO RELATED APPLICATION

This application is a continuation of copending International Application No. PCT/EP01/10752 filed Sep. 17, 2001.

BACKGROUND OF THE INVENTION

This invention relates to a controllable semiconductor component comprising a body of doped semiconductor material, two separate electrodes, each of which contacts the doped semiconductor material of the body and between which an electric operating voltage of the component is to be applied, and a control electrode which is insulated from the semiconductor material of the body by electrically insulating material and to which an electric control voltage is to be applied for controlling the component.

A known example of a component of this type is a unipolar MOS transistor, where the body is known to be made of at least one type of conduction in which one of the two electrodes is a drain electrode, and the other electrode is a source electrode, in which the drain electrode and the source electrode are each in contact with semiconductor material of the same type of conduction as the body, and the control electrode is a gate electrode extending over a doped MOS channel and a doped region adjacent to this channel and opposite from this channel, both being formed of semiconductor material in the body.

One example of such a MOS transistor is known from International Patent Application WO 98/02925. The particular feature of this transistor is that there is also another electrode in addition to the drain electrode, the source electrode and the gate electrode, this additional electrode being situated at a distance laterally from the gate electrode and separated from the semiconductor material of the body by electrically insulating material, and either connected to the source electrode or acted upon by its electric potential.

The additional electrode ensures a comparatively homogeneous field distribution in the edge area of the gate electrode and thus prevents the electric field strength in the semiconductor material from reaching a critical value of approximately $10^5$ V/cm, which would trigger surge ionization and thus electron multiplication.

Another known example of a component of this type is a bipolar IGBT (=isolated gate bipolar transistor) in which the body is known to consist of semiconductor material of different types of conduction, whereby one of the two electrodes is an anode and the other electrode is a cathode; in which the electrode is in contact with the semiconductor material of the type of conduction of the body; in which the cathode is in contact with the semiconductor material of the type of conduction opposite the one type of conduction and/or the same type of conduction of the body; and in which the control electrode is also designated as a gate electrode.

SUMMARY OF THE INVENTION

The object of this invention is to provide a component of the type defined in the preamble in which different electric potentials can be applied to the control electrode simultaneously.

This object can be achieved by a controllable semiconductor component comprising a body of doped semiconductor material, two electrodes that are separated from each other, each contacting the doped semiconductor material of the body, a control electrode which is insulated from the semiconductor material of the body by electrically insulating material, whereby the control electrode has control electrode sections separated from one another by at least one gap.

At least one control electrode section can be connected across an electric resistor to a control terminal of the component for applying the control voltage. An electric resistor can be connected between at least two control electrode sections. A control electrode section which is different from the control electrode section connected across an electric resistor to a control terminal of the component can be connected to one of the two electrodes. The body may consist of semiconductor material of different types of conduction and whereby one of the two electrodes contacts semiconductor material of one type of conduction of the body, and the other electrode contacts semiconductor material of the type of conduction of the body opposite the one type of conduction. The body can be made of semiconductor material of at least one type of conduction and whereby each of the two electrodes contacts semiconductor material of the same type of conduction of the body. One of the two electrodes can be an electrode of the component and the other electrode can be an anode of the component. One of the two electrodes can be a source electrode of the component and the other electrode can be a drain electrode of the component.

The above mentioned object can, thus, be achieved by the fact that according to this invention the control electrode has control electrode sections separated from one another by at least a gap. In other words the control electrode of the component according to this invention is a control electrode divided into two or more control electrode sections separated by one or more gaps and not a single cohesive or continuous control electrode as in the past.

The component according to this invention has the advantage over the known components of the aforementioned type that switching times are significantly reduced.

The component according to this invention is based on the finding that the switching property of a known component of the aforementioned type is determined mainly by a capacitance between one of the two electrodes and the control electrode and a capacitance between the other electrode and the control electrode.

When turning such a component on and/or off, these capacitances must be recharged and a displacement current flows during this phase. The displacement current causes a voltage drop on a resistor through which the control electrode is usually connected to a control terminal of the component for applying the control voltage and this voltage drop increases the voltage at the control terminal of the component.

This resistance is necessary to adjust the switching flanks.

Increasing the voltage at the control terminal of the component is dangerous, especially in the case of a short circuit of the component, because more current flows due to this increased voltage, and this can lead to destruction of the component.

To reduce the voltage drop across the resistor caused by the displacement current, the displacement current may be diverted through a diode connected in antiparallel to the resistor. Another possibility consists of a capacitor connected in parallel with the capacitance between one of the two electrodes and the control electrode.

In the case of the component according to this invention, the displacement current flowing through the resistor when the component is switched on and off and the voltage drop associated with it can be minimized to advantage or even eliminated, so that most of the associated problems mentioned above do not occur.

Another problem in the case of a short circuit of a component of the type defined in the preamble is the occurrence of vibrations which are attributed to a reactive effect between the two electrodes of the component due to the joint capacitance between the two electrodes and the control electrode.

This problem can also be reduced or prevented to advantage with the component according to this invention.

Simulations with a computer simulator have advantageously shown that in the case of the component according to this invention, the on and off losses can be reduced by approx. 15% each. Likewise, the forward-conducting losses can also be reduced. A significant reduction in the Miller phase is advantageously also achieved.

Preferred and advantageous embodiments of the component according to this invention are derived from claims 2 through 8.

BRIEF DESCRIPTION OF THE DRAWINGS

This invention is explained in greater detail in the following description with reference to the figures, which show:

FIG. 7 shows a symbolic diagram of the IGBT according to FIG. 5 illustrating a different type of wiring of the terminals of the control electrode sections of its control electrode; and FIG. 8 shows a symbolic diagram of an MOS transistor according to this invention which also has a type of wiring of the terminals of the control electrode segments of its control electrode.

The figures are schematic and are not drawn to scale.

DETAILED DESCRIPTION OF THE PREFERRED EMBODIMENTS

Figure 1:
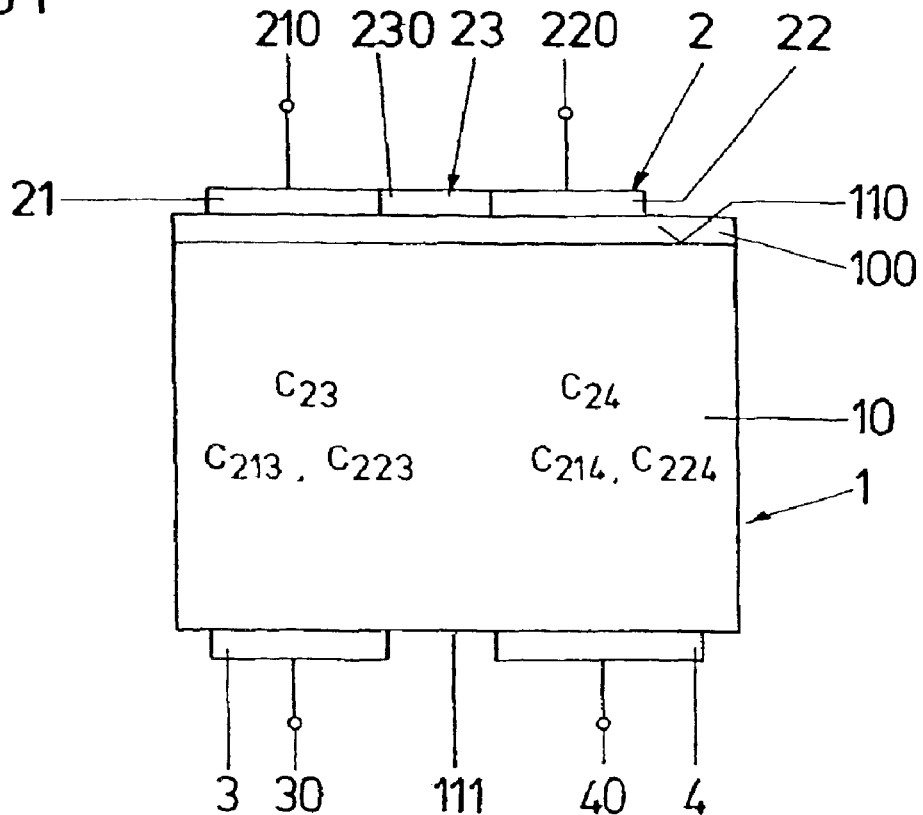
FIG. 1 a side view of the basic design of the component according to this invention.

The basic design of the controllable semiconductor component according to this invention labelled as 1, illustrated in FIG. 1, has a body 10 made of semiconductor material, usually with different types of doping.

The doped semiconductor material of body 10 contacts two separate electrodes 3 and 4 between which an electric operating voltage U of component 1 is to be applied. Electrodes 3 and 4 are, for example, arranged jointly on a side face 111 of body 10. Electrode 3 is connected to an electrode terminal 30 of component 1, and electrode 4 is connected to an electrode terminal 40 of component 1. Electrode terminals 30 and 40 serve the function of applying the operating voltage U between electrodes 3 and 4.

A layer 100 of electrically insulating material is applied to a side face 110 of body 10 facing away from side face 111. A control electrode 2 is applied to this layer 100 and is thus electrically insulated from the semiconductor material of body 10, and an electric control voltage $U_s$ is to be applied to this control electrode for controlling the component 1.

According to this invention, control electrode 2 has control electrode sections separated from one another by at least one gap. In the examples illustrated in the figures, there are only two control electrode sections 21 and 22 separated by a gap 23. Control electrode 2 could also have three or more control electrode sections separated by two or more gaps.

The gap 23 is filled with electrically insulating material 230 which electrically insulates the control electrode sections 21 and 22 from one another on layer 100.

The control electrode section 21 has a terminal 210 and control electrode section 22 has a terminal 220, at least one of which is used for applying the control voltage $U_s$.

The control electrode 2 consisting of the two control electrode sections 21 and 22, as well as the layer 100 of the electrically insulating material, body 10 of the doped semiconductor material and electrode 30 together define a capacitance $C_{23}$. Likewise, the control electrode 2, layer 10 of the electrically insulating material, body 10 of the doped semiconductor material and electrode 4 together define a capacitance $C_{24}$.

These are the two capacitances $C_{23}$ and $C_{24}$ which must be recharged when turning a traditional component on or off, resulting in the abovementioned problems. These problems occur mainly due to the recharging of capacitance $C_{24}$.

In the case of the component according to this invention, the following are also applicable:

the control electrode section 21, layer 100 of electrically insulating material, body 10 of doped semiconductor material and electrode 3 together define a capacitance $C_{213}$;

control electrode section 21, layer 100 of electrically insulating material, body 10 of doped semiconductor material and electrode 4 together define a capacitance $C_{214}$;

the control electrode section 22, layer 100 of electrically insulating material, body 10 of doped semiconductor material and electrode 3 together define a capacitance $C_{223}$, and the control electrode section 22, layer 100 of electrically insulating material, body 10 of doped semiconductor material and electrode 4 together define a capacitance $C_{224}$.

Since each control electrode section 21 and/or 22 is smaller in terms of area on the layer 100 of electrically insulating material than the control electrode 2 consisting of two control electrode sections 21 and 22, it is true that each of the capacitances $C_{213}$, $C_{214}$, $C_{223}$ and $C_{224}$ is smaller than capacitance $C_{23}$ and each is smaller than capacitance $C_{24}$.

Each capacitance $C_{213}$, $C_{214}$, $C_{223}$ and $C_{224}$ is also smaller than the two capacitances of a traditional component corresponding to the capacitances $C_{23}$ and $C_{24}$, these capacitances also being determined by its single continuous control electrode, which is just as large in terms of area on the layer of electrically insulating material of this traditional component as the control electrode 2 having the two control electrode sections 21 and 22 of the component according to this invention.

For example, if only terminal 210 of the control electrode section 21 of control electrode 2 in the component 1 according to this invention is joined across a resistor to a control terminal of component 1 according to this invention, but terminal 220 of the other control electrode section 22 is not, then when turning this component 1 on and off, the unwanted voltage drop across the resistor is advantageously smaller in principle than with this traditional component because a displacement current induced on this resistor by a recharging of capacitances $C_{213}$ and $C_{214}$ is effective, rather than the larger displacement current caused by recharging of the larger capacitances of the traditional component corresponding to capacitances $C_{23}$ and $C_{24}$.

The same thing is also true in comparison with this traditional component is only terminal 220 of the control electrode section 22 of control electrode 2 is connected across a resistor to the control terminal of component 1 according to this invention but terminal 210 of the control electrode section 21 is not.

Control electrode sections 21 and 22 may be selected to extend over areas of different sizes on layer 100 of electrically insulating material.

It is also true that the smaller the area of a control electrode section 21 or 22, the smaller are the capacitances $C_{213}$ and $C_{214}$ and/or $C_{223}$ and $C_{224}$ and the smaller is a displacement current on a resistor connected to this control electrode section 21 or 22, where the displacement current is caused by the recharging of these capacitances $C_{213}$ and $C_{214}$ and/or $C_{223}$ and $C_{224}$ and it is smaller than the voltage drop across the resistor caused by the displacement current.

For the sake of simplicity and without any restriction on generality, it is assumed below that only terminal 210 of control electrode section 21 is connected across the resistor to the control terminal of component 1 according to this invention but terminal 220 of control electrode section 22 is not.

Terminal 220 of control electrode section 22 which is not connected to the resistor is preferably either connected directly, i.e., without an intermediate resistor, to the control terminal of component 1 according to this invention or it is connected directly to terminal 30 or 40 of electrode 3 or 4, respectively, of this component 1.

Each of these direct connections advantageously means that a displacement current caused by recharging of the capacitances $C_{223}$ and $C_{224}$ which are also determined by the control electrode section 22 cannot produce an unwanted voltage drop across a resistor, regardless of the respective size of these capacitances $C_{223}$ and $C_{224}$, and furthermore, such a recharging takes place essentially without any time lag.

The description above with regard to the control electrode section of control electrode 2 which is connected to the control terminal of component 1 according to this invention across the resistor is likewise applicable accordingly if only the control electrode section 22 and not control electrode section 21 of control electrode 2 is connected across the resistor to the control terminal of component 1 according to this invention.

Figure 2:
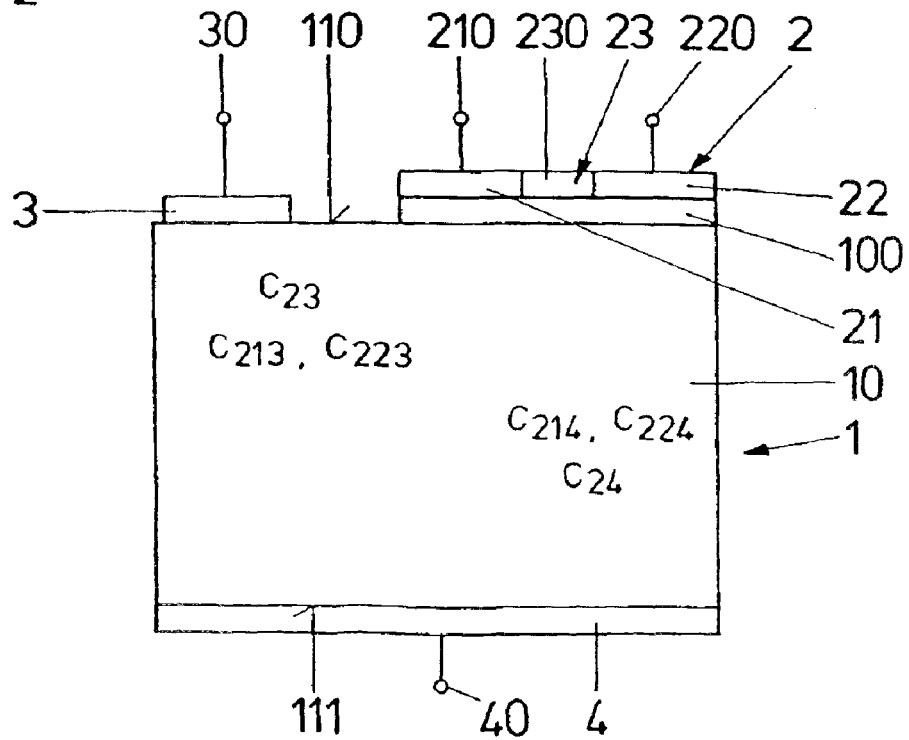
FIGS. 2 through 4 each show side views of some concrete exemplary embodiments of the component according to this invention.
Figure 3:
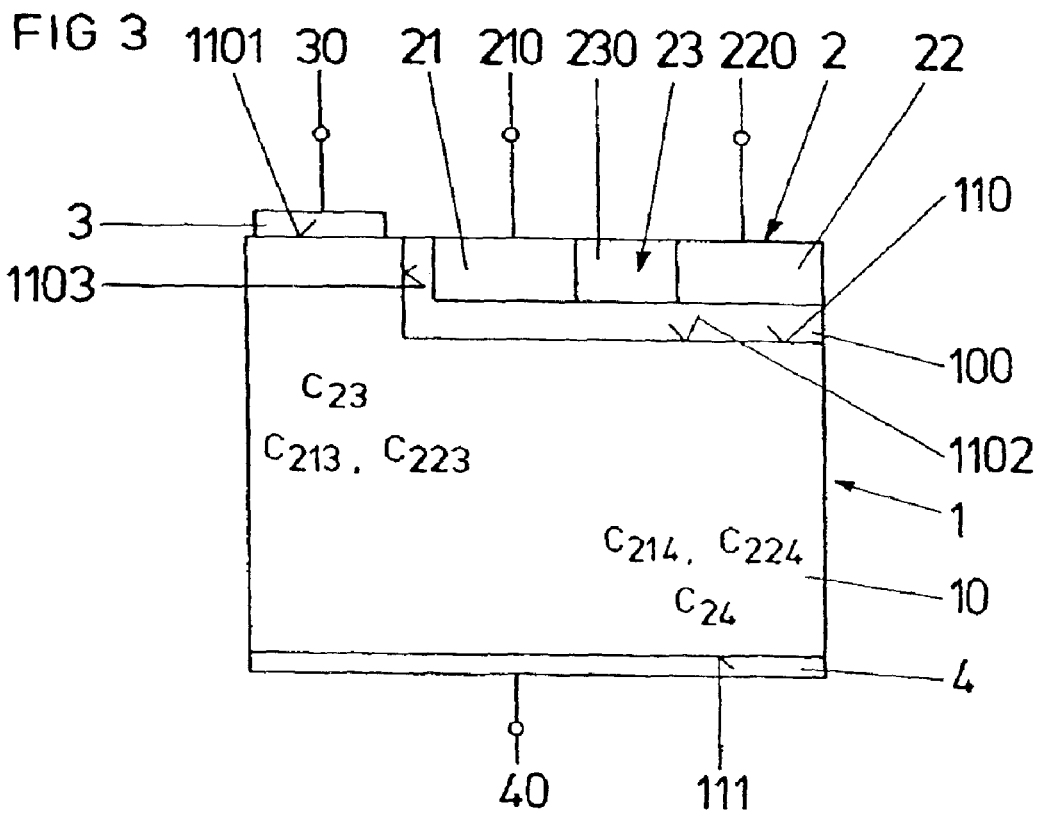
Figure 4:
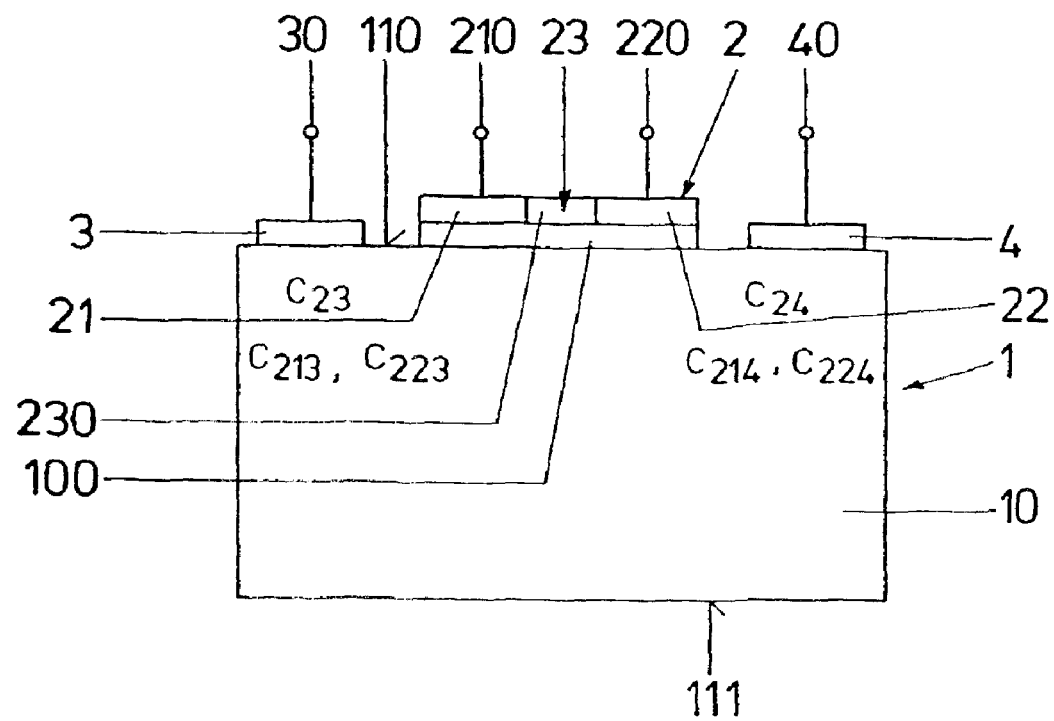

FIGS. 2 through 4 show a few more concrete exemplary embodiments of the component according to this invention, although they are not restrictive in any way, and they are suitable, e.g., for design of this component as an IGBT and/or MOS transistor.

The example according to FIG. 2 differs from the design according to FIG. 1 in that only one of the two electrodes 3 and 4, e.g., electrode 4 is situated on the side face 111 of body 10. The other electrode, namely electrode 3 in this example is situated on the side face 110 of body 10 at the side next to the layer 100 of electrically insulating material which covers this side face 110 only partially.

The example according to FIG. 3 differs from the example according to FIG. 2 only in that the side face 110 has a step 103 which separates a relatively higher section 1101 of side face 110 and a relatively lower section 1102 of side face 110 from one another, whereby the electrode 3 is situated on the higher section 1101, and layer 100 of electrically insulating material covers step 1103 and the lower section 1102.

The example according to FIG. 4 differs from the example according to FIG. 2 only in that the other electrode 4 is also situated on the side face 110 of body 10 at the side next to the layer 100 of electrically insulating material which covers this side face 110 only partially, e.g., so that layer 100 is situated between electrodes 3 and 4.

Figure 5:
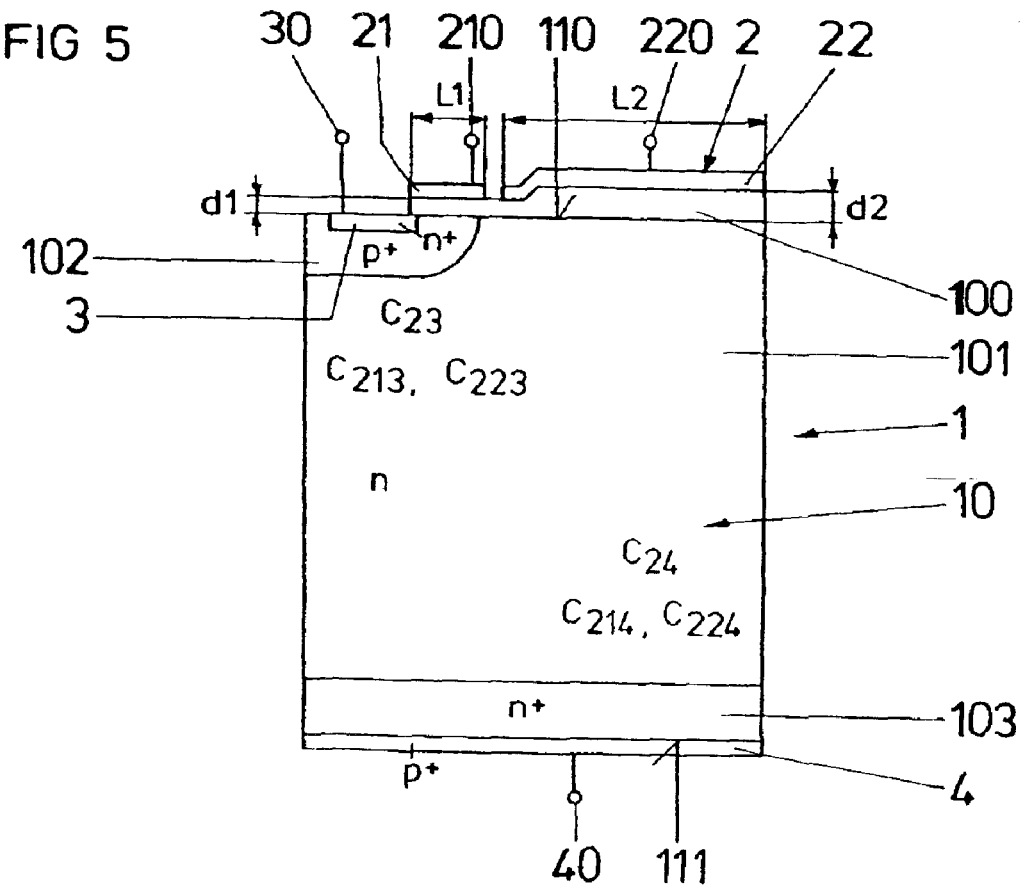
FIG. 5 shows a side view of an IGBT according to this invention based on the example according to FIG. 2.

The IGBT 1 shown as an example in FIG. 5 is based for example on the structure according to FIG. 2.

Body 10 of this IGBT 1 consists essentially of n-doped semiconductor material, e.g., n-doped silicon. Electrode 4, which is defined, for example, by a layer of p+-doped silicon and which forms an anode of IGBT 1, is situated on the side face 111 of body 10, and is connected to an anode terminal 40 of the IGBT 1.

An n+-doped region 103, which is formed in body 10, is adjacent to anode 4. An n-doped region 101 is adjacent to region 103 and extends up to the other side face 110 of body 10 facing away from the one side face 111.

A p+-doped trough 102 is formed in area 101 and is adjacent to the other side face 110 of body 10 and defines a doped MOS channel in body 10.

In the area of trough 102, electrode 3 is arranged on the other side face 110. Electrode 3 is defined, for example, by an n+-doped layer which is formed in the trough 102 and is adjacent to the side face 110 and is completely surrounded by p+-doped material of trough 102. Electrode 3 forms a cathode of the IGBT 1 and is connected to a cathode terminal 30 of IGBT 1.

Layer 100 of electrically insulating material, e.g., silicon dioxide is applied to side face 110 of body 10. The electrically insulating layer 100 extends from one edge side of electrode 3 over the trough 102 adjacent to the side face 110 of body 10 and over the n-doped region 101 of body 10 adjacent to trough 102 and side face 110 of body 10.

The control electrode 2 of the IGBT 1, which is referenced to below as the gate electrode, is arranged on the electrically insulating layer 100, where the IGBT consists of the two control and gate electrode sections 21 and 22, which are separated from one another by gap 23, whereby gate electrode section 21 is connected to a gate electrode terminal 210 and gate electrode section 22 is connected to a gate electrode terminal 220.

For example, gate electrode section 21 extends over trough 102 adjacent to the side face 110 of body 10, and gate electrode section 22 extends essentially over the n-doped region 101 outside of trough 102 and adjacent to the side face 110 of body 10.

It is advantageous that the gate electrode section 21 need extend essentially only over the trough 102 adjacent to the side face 110 of body 10 and need not extend beyond the trough 102. In other words, the gate electrode section 21 extends essentially only over the doped MOS channel 102 of the IGBT 1 adjacent to the side face 110 of body 10 and for this reason it is advantageously smaller in terms of area than a gate electrode of a traditional IGBT which extends over a doped MOS channel and additionally outside of this channel over a region adjacent to the channel and doped with the opposite type of doping from the body of semiconductor material of this IGBT.

However, the area of the gate electrode section 21 on layer 100 of electrically insulating material of the IGBT is limited at the lower end because this area essentially coincides with the area of the doped MOS channel 102 adjacent to the side face 110 of body 10 and should not be smaller than this area of the MOS channel 2. Accordingly, the area of the gate electrode section 21 on layer 100 of electrically insulating material of the IGBT 1 is essentially fixedly predetermined.

The gate electrode section 21 of IGBT 1 takes up a smaller area on the electrically insulating layer 100, for example, than the gate electrode section 22 extending over only the n-doped region 101 outside of trough 102 and adjacent to the side face 110 of body 10. This can be seen by the fact that in FIG. 5 the length L1 of the gate electrode section 21 is shorter than the length L2 of the gate electrode section 22.

The area of the gate electrode section 22 on the electrically insulating layer 100, however, is not fixedly predetermined but instead may be selected to be variable to advantage. In particular this area may also be smaller than the corresponding area of the gate electrode section 21, whereby in principle there is no lower limit.

The gate electrode sections 21 and 22 are each made of electrically conducting material, e.g., polysilicon.

The gap 23 between the gate electrode sections 21 and 22 is preferably filled with a solid electrically insulating material, e.g., polyimide. This measure guarantees that potential sparkovers between the two gate electrode sections 21 and 22 will be prevented.

The thickness d1 of the electrically insulating layer 100 beneath the gate electrode section 21 is smaller than the thickness d2 of this layer 100 beneath the gate electrode section 22. This has the effect that the capacitances $C_{223}$ and $C_{224}$ which are also determined by this gate electrode section 22 are advantageously smaller than in the case when d2 is selected to be equal to d1.

Figure 6:
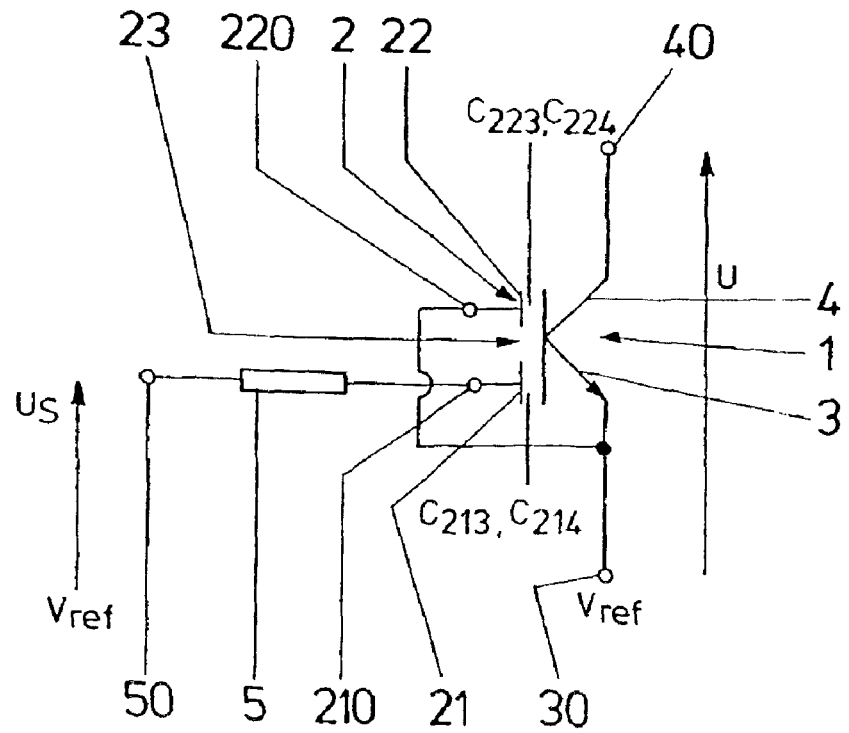
FIG. 6 shows a symbolic diagram of the IGBT according to FIG. 5, showing a first type of wiring of the terminals of the control electrode sections of its control electrode.

The circuit diagrams according to FIGS. 6 and 7 are each based on the IGBT according to FIG. 5.

In both circuit diagrams, the gate electrode terminal 210 of the gate electrode section 21 is connected across a resistor 5 to an outer control terminal or gate terminal 50 of the IGBT 1.

In the circuit diagram according to FIG. 6, the gate electrode terminal 220 of the gate electrode section 22 is connected directly to the cathode 3 of the IGBT 1. Therefore, the displacement current caused by recharging of the capacitances $C_{223}$ and $C_{224}$ when turning the IGBT 1 on and/or off is sent directly to the cathode terminal 30 of the IGBT 1, thus interrupting a feedback effect of the anode terminal 30 on the cathode terminal 40.

In the circuit diagram according to FIG. 7, the gate electrode terminal 220 of the gate electrode section 22 is connected directly to the outer gate terminal 50 of IGBT 1. Therefore, the capacitances $C_{223}$ and $C_{224}$ are connected directly to the gate voltage Us which is between the gate terminal 50 and a reference potential Vref which is also the potential of the cathode terminal 30. This ensures that capacitances $C_{213}$, $C_{214}$, $C_{223}$ and $C_{224}$ are at the same potential Vref+Us in static operation.

In the case of an IGBT 1 wired according to the circuit diagrams in FIGS. 6 and 7, the size of the area of the gate electrode section 22 on layer 100 advantageously plays only a subordinate role, if not even a negligible role.

What is applicable to the IGBT 1 may also apply accordingly to a component 1 according to this invention in the form of a MOS transistor.

The wiring diagram according to FIG. 8 shows as an example symbolically a MOS transistor 1 according to this invention which is wired according to the IGBT 1 in FIG. 7.

Accordingly, with this MOS transistor 1 according to FIG. 8 the gate electrode terminal 210 of gate electrode section 21 of gate electrode 2 is connected across a resistor 5 to an outer control terminal or gate terminal 50 of MOS transistor 1. The gate electrode terminal 220 of the other gate electrode section 22 of gate electrode 2 is connected directly to the outer gate terminal 50 of the MOS transistor 1. Therefore the capacitances $C_{223}$ and $C_{224}$ are connected directly to the gate voltage Us which is between the gate terminal 5 and a reference potential Vref which is also the potential of the electrode terminal 30 of electrode 3 of transistor 1, thus forming the source electrode of MOS transistor 1. This guarantees that the capacitances $C_{213}$, $C_{214}$, $C_{223}$ and $C_{224}$ are at the same potential Vref+Us in static operation. Electrode 4 of MOS transistor 1 which is connected to electrode terminal 40 forms the drain electrode of MOS transistor 1.

As an alternative, the MOS transistor 1 according to FIG. 8 could also be wired according to the IGBT 1 shown in FIG. 6 with a similar effect.

The description of the area of the gate electrode section 21 on layer 100 with respect to the MOS channel and the area of gate electrode section 22 of the IGBT 1 according to FIGS. 5 through 7 also applies to MOS transistors 1 according to FIG. 8 in the same way.

What is claimed is:

1. A controllable semiconductor component comprising:
    a body of doped semiconductor material,
    two electrodes that are separated from each other, each contacting the doped semiconductor material of the body, and whereby an electric operating voltage of the component can be applied between them, and
    a control electrode which is insulated from the semiconductor material of the body by electrically insulating material and to which an electric control voltage can be applied to control the component, whereby
    the control electrode has at least a-first and second control electrode sections separated from one another by at least one gap and wherein said first control electrode section covers a smaller area than said second control electrode section, and wherein said first control electrode section is connected across an electric resistor to a control terminal of the component for applying the control voltage and the electric resistor is connected between said first and second control electrode sections.

2. The component according to claim 1, whereby the body consists of semiconductor material of different types of conduction and whereby one of the two electrodes contacts semiconductor material of one type of conduction of the body, and the other electrode contacts semiconductor material of a type of conduction of the body opposite the one type of conduction of the body.

3. The component according to claim 2 whereby one of the two electrodes is an electrode of the component and the other electrode is an anode of the component.

4. The component according to claim 1, whereby the body is made of semiconductor material of at least one type of conduction and whereby each of the two electrodes contacts semiconductor material of the same type of conduction of the body.

5. The component according to claim 4, whereby one of the two electrodes is a source electrode of the component and the other electrode is a drain electrode of the component.

6. The component according to claim 1, whereby one of the two electrodes is an electrode of the component and the other electrode is an anode of the component.

7. The component according to claim 1, whereby one of the two electrodes is a source electrode of the component and the other electrode is a drain electrode of the component.

8. The component according to claim 1, wherein said first control electrode section is insulated from the semiconductor material of the body by an insulating layer having a first thickness and said second control electrode section is insulated from the semiconductor material of the body by an insulating layer having a second thickness, wherein the first thickness is smaller than the second thickness.

9. The component according to claim 1, wherein said at least one gap is filled with a solid electrically insulating material.

10. The component according to claim 9, wherein said solid electrically insulating material is polyimide.

11. A controllable semiconductor component comprising:
a body of doped semiconductor material,
two electrodes that are separated from each other, each contacting the doped semiconductor material of the body, and whereby an electric operating voltage of the component can be applied between them, and
a control electrode which is insulated from the semiconductor material of the body by electrically insulating material and to which an electric control voltage can be applied to control the component, whereby
the control electrode has at least first and second control electrode sections separated from one another by at least one gap and wherein said first control electrode section covers a smaller area than said second control electrode section, wherein said first control electrode section is connected across an electric resistor to a control terminal of the component for applying the control voltage and wherein said second control electrode section which is different from the first control electrode section connected across the electric resistor to the control terminal of the component is connected to one of the two electrodes.

12. The component according to claim 11, whereby the body consists of semiconductor material of different types of conduction and whereby one of the two electrodes contacts semiconductor material of one type of conduction of the body, and the other electrode contacts semiconductor material of a type of conduction of the body opposite the one type of conduction of the body.

13. The component according to claim 12 whereby one of the two electrodes is an electrode of the component and the other electrode is an anode of the component.

14. The component according to claim 11, whereby the body is made of semiconductor material of at least one type of conduction and whereby each of the two electrodes contacts semiconductor material of the same type of conduction of the body.

15. The component according to claim 14, whereby one of the two electrodes is a source electrode of the component and the other electrode is a drain electrode of the component.

* * * * *